United States Patent
Murakami et al.

(10) Patent No.: US 7,155,753 B2
(45) Date of Patent: Jan. 2, 2007

(54) CONTROL DEVICE FOR SANITARY DEVICE FOR TOILET ASSEMBLY

(75) Inventors: Kouji Murakami, Aichi-ken (JP); Shunichi Teranishi, Aichi-ken (JP); Mitsuhiro Ohara, Aichi-ken (JP); Takashi Muto, Aichi-ken (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 0 days.

(21) Appl. No.: 10/166,166

(22) Filed: Jun. 11, 2002

(65) Prior Publication Data

US 2002/0184702 A1    Dec. 12, 2002

(30) Foreign Application Priority Data

Jun. 18, 2001  (JP)  ............................. 2001-183847
Jun. 18, 2001  (JP)  ............................. 2001-183873
Jun. 11, 2002  (JP)  ............................. 2001-176238

(51) Int. Cl.
  *E03D 11/00*    (2006.01)
(52) U.S. Cl. ........................................................ 4/443
(58) Field of Classification Search ............ 4/443–448, 4/420.1–420.5
  See application file for complete search history.

(56) References Cited

U.S. PATENT DOCUMENTS 5,421,039 A * 6/1995 Hirashiba et al. ............ 4/420.2
5,730,149 A * 3/1998 Nakayama et al. .......... 600/573
5,902,153 A * 5/1999 Weickenmeier et al. .... 439/621
6,430,366 B1 * 8/2002 Mizutani et al. ............. 392/449

FOREIGN PATENT DOCUMENTS

JP      7-321472        12/1995
KR    2000-0010166       6/2000

* cited by examiner

Primary Examiner—Huyen Le
(74) Attorney, Agent, or Firm—Oblon, Spivak, McClelland, Maier & Neustadt, P.C.

(57) ABSTRACT

A control device for a sanitary device for a toilet assembly which reduces the size of a control case and increases the damp-proof characteristics of an electrically conductive member by restricting the invasion of water, urine, and moisture content. The control device includes a shower portion for washing the anus or genitals of an individual that includes a control case made of resin and having an accommodation chamber therein. The control device includes mounted devices having an electric part and an electronic part accommodated in the accommodation chamber of the control case, and an electrically conductive member made of electrically conductive material and embedded in a wall portion of the control case and having a first end portion electrically connected to a part of the mounted devices and a second end portion electrically connected to another part of the mounted devices in the accommodation chamber.

12 Claims, 8 Drawing Sheets

CONTROL DEVICE FOR SANITARY DEVICE FOR TOILET ASSEMBLY

REFERENCE TO RELATED APPLICATIONS

This application is based on and claims priority under 35 U.S.C. §119 to Japanese Application No. 2001-176238 filed on Jun. 11, 2001, Japanese Application No. 2001-183847 filed on Jun. 18, 2001, and Japanese Application No. 2001-183873 filed on Jun. 18, 2001, the entire contents of which are incorporated herein by reference.

FIELD OF THE INVENTION

The present invention generally relates to a control device for a sanitary device for a toilet assembly. More particularly, the present invention pertains to a control device for a sanitary device for toilet assembly including a shower portion for washing the anus or genitals of an individual by spurting cleansing fluid thereon.

BACKGROUND OF THE INVENTION

Sanitary devices for toilet assemblies generally include a base portion, a toilet seat provided on the base portion for an individual to sit on, a shower portion equipped on the base portion for washing the anus and genitals of an individual by spurting cleansing fluid thereon, and a control device for controlling the operation of the shower portion. Downsizing of the sanitary device for a toilet assembly as a whole is demanded. Particularly, it is desired to downsize the sanitary device so that the device can be easily installed in small bathrooms of apartments and studios in accordance with the diffusion of the sanitary device for a toilet assembly. Because the sanitary device is installed in the bathroom for an extended period of time, water, urine, and moisture may enter the device. Thus, mounted devices such as electronic parts and electric parts require being resistant to dampness.

Japanese Patent Laid-Open Publication No. H07-321472 describes a control device for a sanitary device for a toilet assembly having a construction in which the entire control board is accommodated in a resin-made open-type control case and the parts such as the electronic parts and the electric parts mounted on the control board are covered with elastic sealant such as urethane and epoxy along with the control board in order to damp proof the control board including the mounted devices. According to this known device, the resistance to dampness of the mounted devices such as electronic parts and electric parts can be improved, thus advantageously improving the lifecycle of the device.

Furthermore, according to a device described in the Japanese Patent Laid-Open Publication No. H07-321472, two control boards are piled keeping a predetermined distance from each other so that mounted devices mounted on the mounting surfaces of the respective control boards are arranged to be back-to-back. This configuration limits the degree of miniaturization of the control case.

In addition, according to the device described in the Japanese Patent Laid-Open Publication No. H07-321472, each electrically conductive lead of mounted devices such as electronic devices and electric devices mounted on the control board are exposed from the control board. Thus, further space is required for the exposed lead, which limits the degree of miniaturization of the control case.

A need thus exists for a control device for a sanitary device for a toilet assembly, which has advantages for miniaturization of a control case and for restricting the invasion of the water, urine, and moisture to an electrically conductive member by improving the devices's resistance to dampness.

SUMMARY OF THE INVENTION

In light of the foregoing, the present invention provides a control device applied to a sanitary device for a toilet assembly including a shower portion spurting cleansing fluid to anus or genitals of an individual for washing thereof. The control device includes a control case made of resin and including an accommodation chamber therein, mounted devices including an electric part and electronic part accommodated in the accommodation chamber of the control case, and an electrically conductive member made of electrically conductive material and embedded in a wall portion of the control case. The electrically conductive member has a first end portion electrically connected to a part of the mounted devices and a second end portion electrically connected to another part of the mounted devices in the accommodation chamber.

According to another aspect of the present invention, a sanitary device for a toilet assembly is provided that includes a base portion, a toilet seat provided on the base portion for seating an individual, a shower portion spurting cleansing fluid to the anus or genitals of an individual for washing thereof, a control device for controlling an operation of the shower portion, and a control case made of resin and including an accommodation chamber therein. The sanitary device also includes mounted devices including an electric part and electronic part accommodated in the accommodation chamber of the control case, and an electrically conductive member made of electrically conductive material and embedded in a wall portion of the control case. The electrically conductive member has a first end portion electrically conductive to part of the mounted devices and a second end portion electrically conductive to another part of the mounted devices in the accommodation chamber. The sanitary device further includes a mounting surface for mounting at least part of the mounted devices, and a plurality of control boards stacked keeping a predetermined distance in the accommodation chamber.

BRIEF DESCRIPTION OF THE DRAWING FIGURES

The foregoing and additional features and characteristics of the present invention will become more apparent from the following detailed description considered with reference to the accompanying drawing figures in which like reference numerals designate like elements.

DETAILED DESCRIPTION OF THE INVENTION

Figure 1:
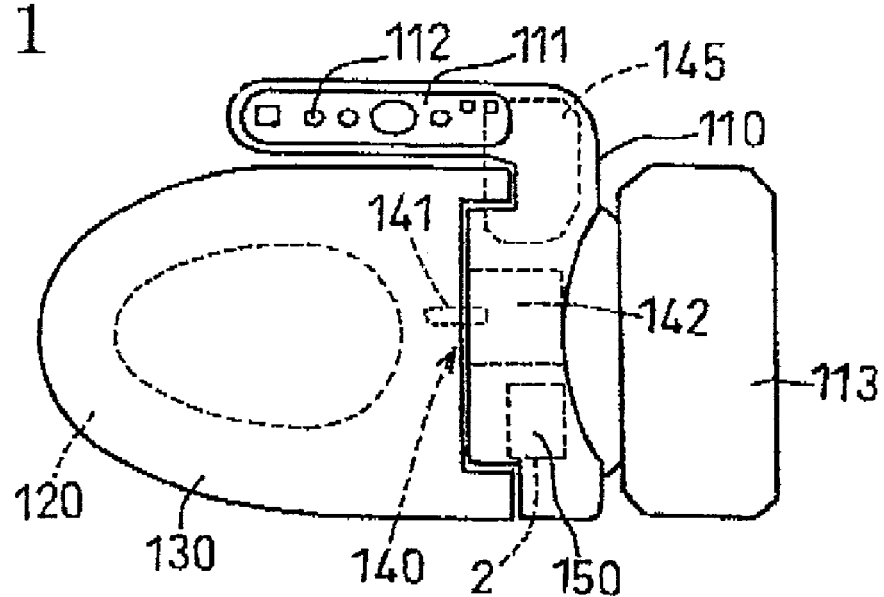
FIG. 1 is a plan view of a control device for a sanitary device for a toilet assembly equipped on a toilet.
Figure 2:
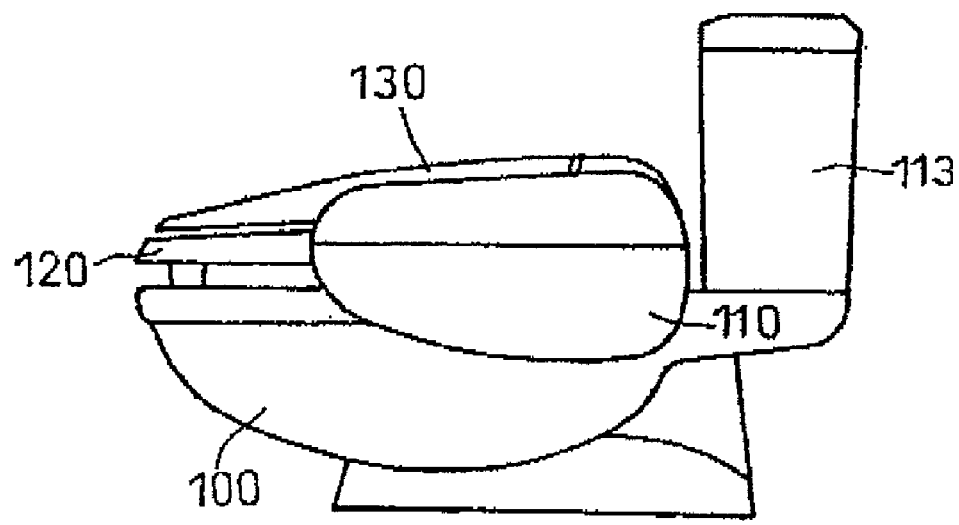
FIG. 2 is a side view of a control device for a sanitary device for a toilet assembly equipped on the toilet.

Referring to FIGS. 1–14, an embodiment of a control device for a sanitary device for a toilet assembly of the present invention will be explained as follows. FIGS. 1–2 show a whole view of the sanitary device for a toilet assembly. The sanitary device for toilet assembly includes a base portion 110 installed in a toilet 100, a toilet seat 120 rotatably provided on the base portion 110 for a user to sit, a lid 130 rotatably provided on the base portion 110, a shower portion 140 provided on the base portion 110 for washing the anus and genitals by spurting the water as the cleansing fluid to the anus and genitals of the user, and a control device 150 for controlling the operation of the shower portion 140. The base portion 110 includes an operation panel 111 provided with a various switches 112 on the side. A warm water tank 145 is provided in the base portion 110, where the warm water tank 145 has a heater for supplying warm water to the shower potion 140. A water tank 113 for supplying the water to the toilet 100 is provided on the back of the toilet 100. The switches 112 includes a cleansing start switch for starting the cleansing transaction by spurting the cleansing fluid from the shower portion 140, a cleansing end switch for ending the cleansing transaction, and a switch for turning on a built-in heater in the toilet seat. The shower portion 140 includes a water supply cylinder 141 movable in a forward direction and a rearward direction and capable of supplying water from the water tank 113. The shower portion includes an actuation portion 142 including a motor for moving the water supply cylinder 141 in the forward and the rearward directions. A control device 150 includes a box-shaped control case 2, which is made of resin (e.g., PBT).

Figure 3:
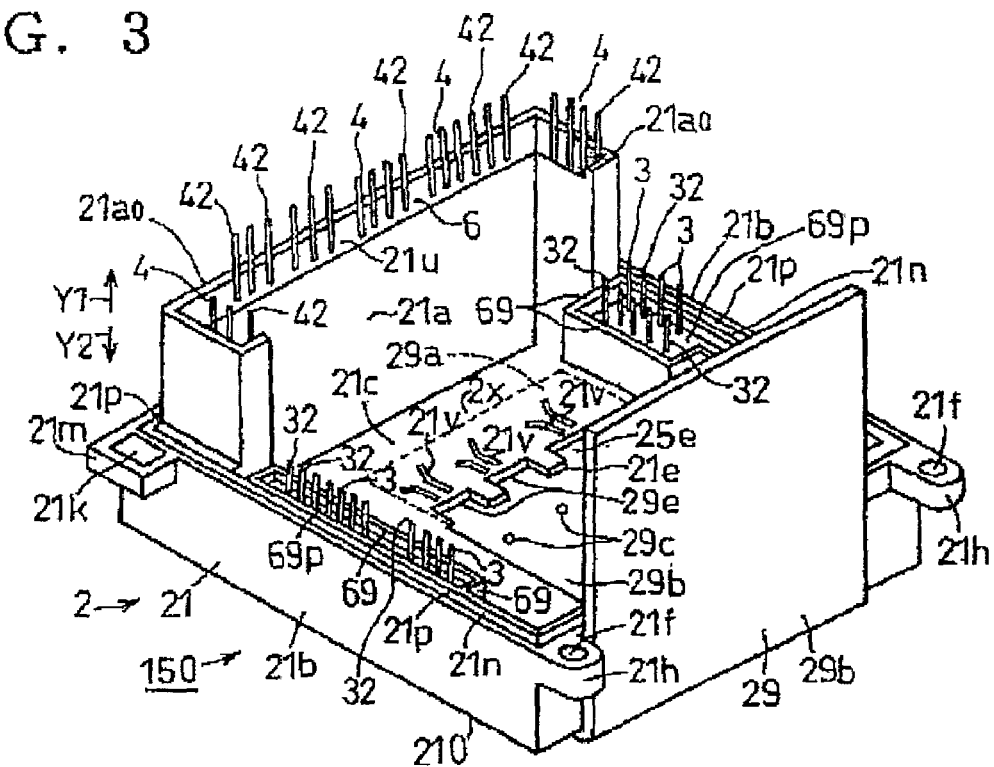
FIG. 3 is a perspective view showing a top case having an embedded lead wire and a heat sink.

The details of the control case 2 will be explained as follows. FIG. 3 shows a case 21 serving as a first case constructing the control case 2. The top case 21 includes a tall wall portion 21a and a small wall portion 21b, which form an accommodation chamber 2x inside. A heat sink 29 made of metal with high heat radiation (e.g., an aluminum alloy) is unitarily provided on the top case 21 by insert forming. The heat radiation sink 29 has an L-shaped cross-section for ensuring the heat radiation dimension while reducing the size. The heat sink 29 includes an embedded portion 29a unitarily embedded in a wall portion 21c of the top case 21 to be concealed and an exposed portion 29b exposed from the top case 21. The external wall surface of the exposed portion 29b of the heat sink 29 faces the outside. The internal wall of the exposed portion 29b of the heat sink 29 faces the accommodation chamber 2x side. Thus, the heat radiation efficiency of the exposed portion 29b of the heat sink 29 is ensured. When the control case 2 is provided on the sanitary device for a toilet assembly, the embedded portion 29a of the heat sink 29 is positioned on the top surface side of the control case 2.

Although the wall portion 21c of the top case 21 includes an opening 21e, the heat sink 29 seals and closes the opening 21e, and thus seals the accommodation chamber 2x. Because the heat sink 29 closes the accommodation chamber 2x of the top case 21, the sealing performance and the damp-proof characteristic of the accommodation chamber 2x is increased. Because the embedded portion 29a of the heat sink 29 is embedded in the wall portion 21c of the top case 21 to be a unitary structure, a fixture tool for mounting the heat sink 29 to the control case 2 is not required. In addition to the heat radiation function by the heat sink 29, the heat sink 29 provided a reinforcement function for reinforcing the wall portion 21c of the control case 2. Furthermore, the amount of the resin used for constructing the top case 21 can be reduced.

Screw portion 29c have female screw bores for fixing a heat element 57 for each to be positioned in the accommodation chamber 2x are provided on the exposed portion 29b of the heat sink 29. Concave shaped positioning portions 29e are formed on the top case 21 for determining the position of heat elements 57 by contacting the heat element 57 to the heat sink 29.

As shown in FIG. 3, first boss portions 21h having first connecting bores 21f are formed in a unitary manner on the top case 21 on one side of the top case 21. Engagement portions 21m having engagement bores 21k are formed in a unitary manner on the top case 21 on the other side of the control case 2 opposite the first boss portions 21h.

As shown in FIG. 3, an annular sealing groove 21n surrounding on the entire periphery of the top case 21 is formed on the top case 21. An annular sealing member 21p made of elastic material such as rubber and resin is fitted in the sealing groove 21n. The sealing performance of the accommodation chamber 2x of the control case 2, thus the damp-proof characteristic of the accommodation chamber 2x of the control case 2 is improved by the sealing effect of the sealing member 21p.

As shown in FIG. 3, according to this embodiment, a first lead wire 3 functioning as an electrically conductive member is embedded within the wall thickness of the small wall 21b to be formed in a unitary manner by insert forming. Likewise, a second lead wire 4 functioning as an electrically conductive member is embedded within wall thickness of the tall wall portion 21a to be formed in a unitary manner by insert forming. The first lead wire 3 and the second lead wire 4 are made of metal which is the electrically conductive material, for example, copper alloy such as phosphor bronze which excels in electrical conductivity, rigidity, and corrosion resistance. Numerous first lead wires 3 and second lead wires 4 are embedded in the top case 21.

Figure 5:
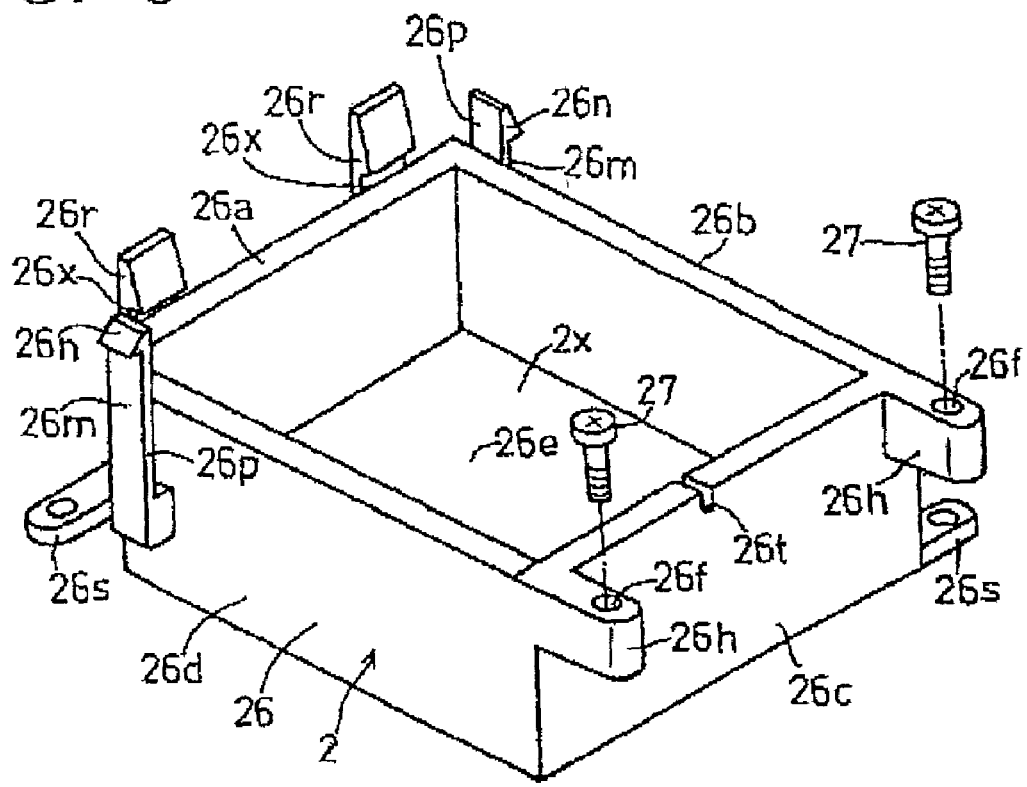
FIG. 5 is a perspective view of a bottom case.

FIG. 5 shows a bottom case 26 serving as a second case. The bottom case 26 and the top case 21 are combined to form the control case 2. The resin made box-shaped bottom case 26 includes wall portions 26a, 26b, 26c, 26d, and 26e. The bottom case 26 includes second boss portions 26h having second connection bores 26f, snap fit portions 26p functioning as case connecting means each having an elastic arm 26m and a pawl portion 26n, hook portions 26r forming spaces 26x for locating lead wires of mating connector portion 7A, 7B between external surfaces of the bottom case 26, and stays 26s functioning as control case fixing portions detachably fixing the control case 2 to the base portion 110 of the sanitary device for toilet assembly. The top case 21 and the bottom case 26 are detachably unitary connected by detachably engaging the snap fit portions 26p of the bottom case 26 to the engagement bores 21k of the engagement portions 21m of the top case 21 and by screwing connecting screws 27 in the second connecting bores 26f of the second boss portions 26h of the bottom case 26 and the first connecting cores 21f of the first boss portions 21h of the top case 21. Thus, the control case 2 is formed having an accommodation chamber 2x under hermetically sealed or substantially hermetically sealed condition. In the foregoing embodiment, because the sealing member 21p fitted in the sealing groove 21n formed on the mating face of the top case 21 is provided on the border between the top case 21 and the bottom case 26, the sealing between the mating face of the top case 21 and the mating face of the bottom case 26 is ensured to improve the hermetically sealed and damp-proof characteristic of the accommodation chamber 2x.

Figure 6:
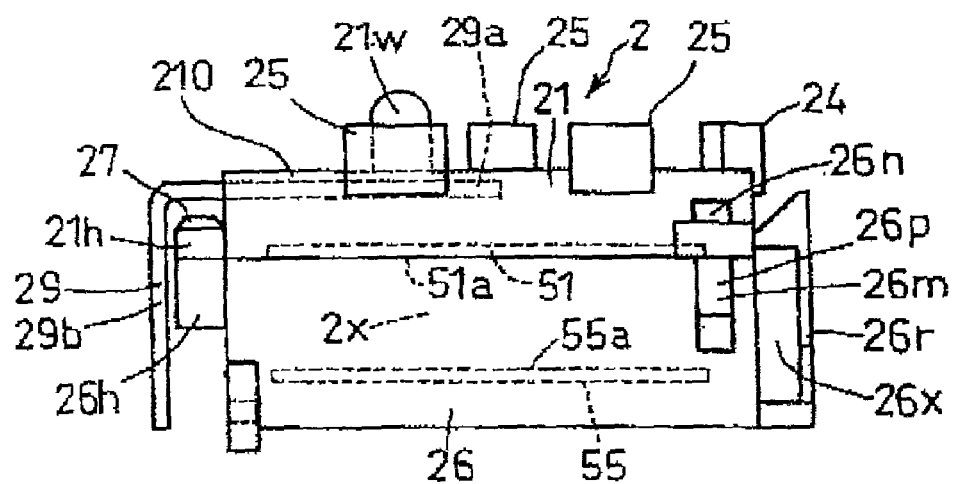
FIG. 6 is a side view of a control case formed by connecting the top case and the bottom case.
Figure 7:
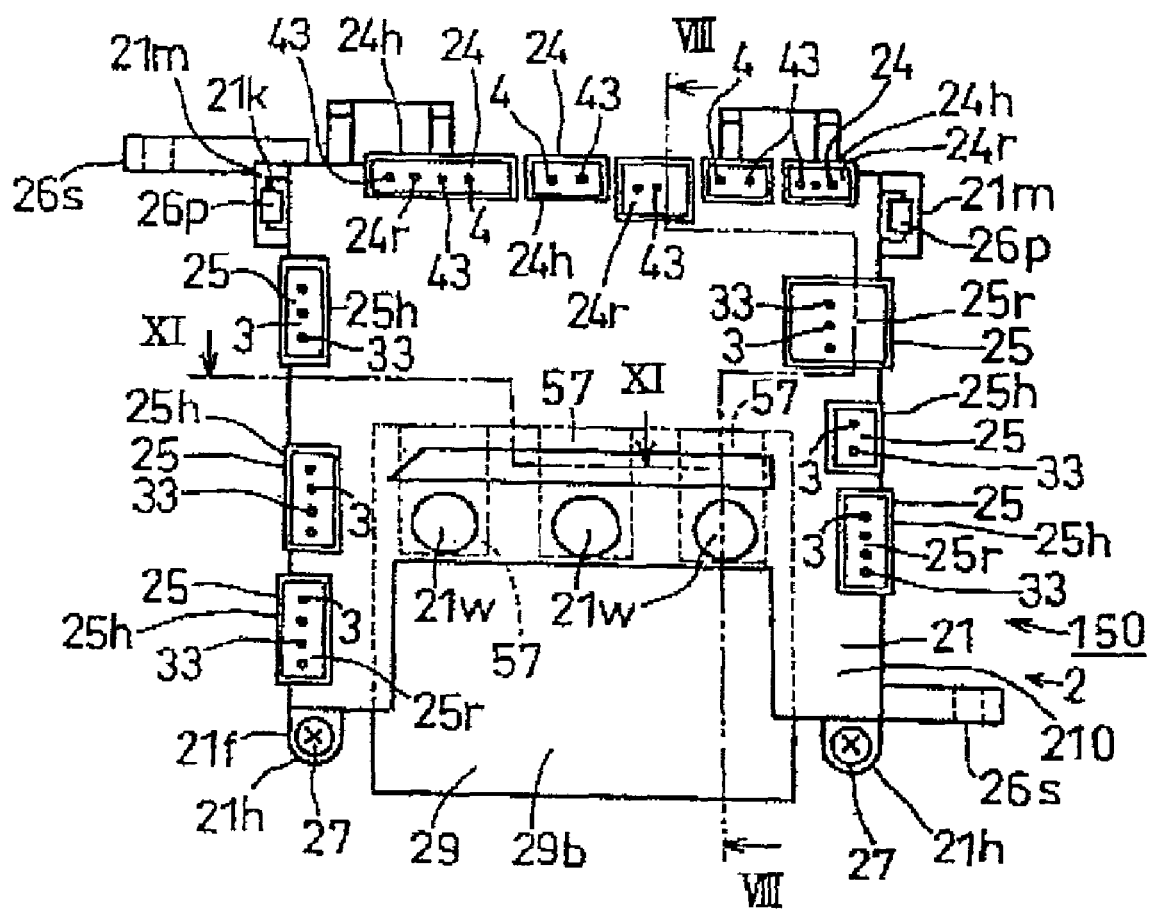
FIG. 7 is a plan view of the control case formed by connecting the top case and the bottom case.
Figure 8:
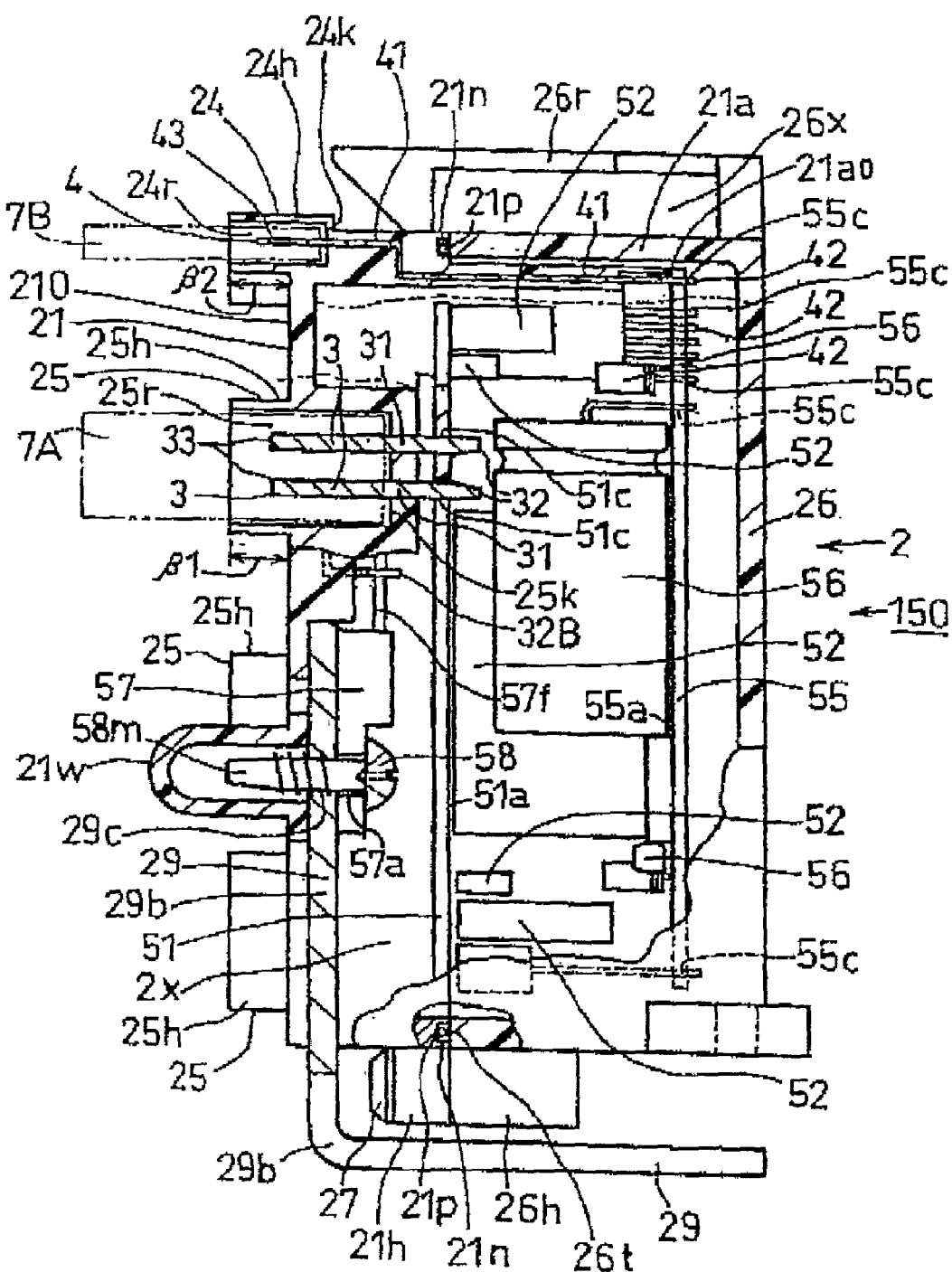
FIG. 8 is a cross-sectional view taken along line VIII—VIII in FIG. 7 showing an internal structure of the control case formed by connecting the top case and the bottom case.

FIGS. 6–8 show the assembly of the control case 2 by connecting the top case 21 and the bottom case 26. As mentioned above, because the sealing member 21p fitted in the sealing groove 21n is provided on the border between the top case 21 and the bottom case 26, the sealing between the top case 21 and the bottom case 26 is ensured to improve the sealing performance and the damp-proof characteristic of the accommodation chamber 2x.

As shown in FIG. 8, the first lead wire 3 includes a first embedded electrically conductive portion 31 embedded to be concealed in the wall of the top case 21, a first internally exposed electrically conductive portion 32 exposed inwardly from the top case 21, and a first externally exposed electrically conductive portions 33 exposed outwardly from the top case 21. The exposure of a portion of the first lead wire 3 from the top case 21 is advantageous to release Joule heat generated in the first lead wire 3. The first embedded electrically conductive portion 31 corresponds to the middle portion of the first lead wire 3. The first internally exposed electrically conductive portion 32 corresponds to one end portion of the first lead wire 3. The first externally exposed electrically conductive portions 33 correspond to the other end of the first lead wire 3.

As shown in FIG. 8, likewise, the second lead wire 4 includes a second embedded electrically conductive portion 41 embedded to be concealed in the wall of the top case 21, a second internally exposed electrically conductive portion 42 exposed inwardly from the top case 21, and a second externally exposed electrically conductive portion 43 exposed outwardly from the top case 21. The exposure of a portion of the second lead wire 4 from the top case 21 is advantageous to release Joule heat generated in the second lead wire 4. The second embedded electrically conductive portion 41 corresponds to the middle portion of the second lead wire 4. The second internally exposed electrically conductive portion 42 corresponds to one end portion of the second lead wire 4. The second externally exposed electrically conductive portion 43 corresponds to the other end of the second lead wire 4.

Figure 4:
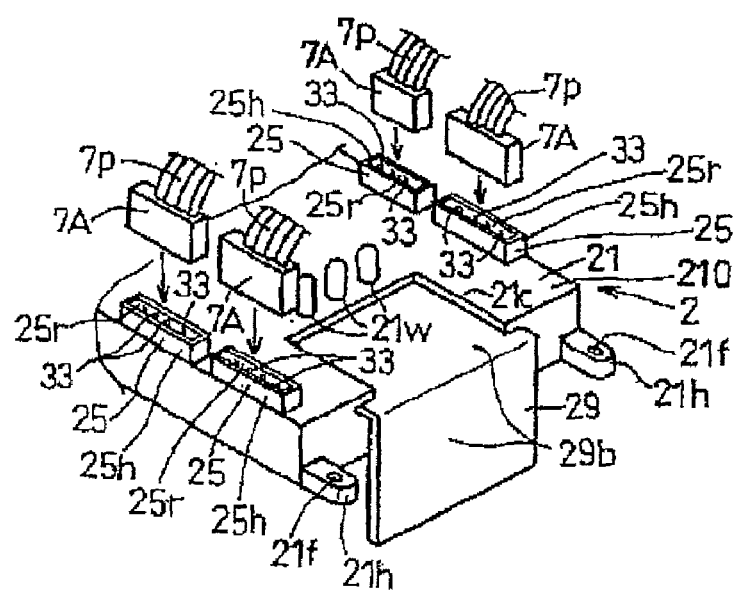
FIG. 4 is a perspective view of a main portion showing a mode for connecting a connector portion provided on the top case and a mating connecting portion.

As shown in FIG. 4, connector portions 25 are unitary formed on the external wall surface 210 of the top case 21 to be projected therefrom. The connector portions 25 electrically conducting with the mating connector portions 7A having the conducting wire portions 7p include box-shaped connector housing portions 25h having fitting spaces 25r unitary formed on the top case 21. As shown in FIG. 8, the first externally exposed electrically conductive portions 33 of the first lead wire 3 construct a pin contact to be exposed tot he fitting spaces 25r of the connector housing portions 25. As shown in FIG. 8, when the mating connector portions 7A are fitted to the fitting spaces 25r of the connector housing portions 25h of the connector portions 25 respectively, the first externally exposed electric conducive 33 of the first lead wires 3 are fitted to the mating electrically conductive members of the mating connector portions 7A to be electrically connected.

As shown in FIG. 7, connector portions 24 unitarily formed on the top case 21 are provided on different portions of the external wall surface 210 of the top case 21. The connector portions 24 include box-shaped connector housing portions 24h having fitting spaces 24r formed in a unitary manner with the top case 21. As shown in FIG. 8, the second externally exposed electrically conductive portions 43 of the second lead wires 4 are exposed to the fitting spaces 24r of the connector housing portions 24h. When the mating connector portions 7B are fitted into the fitting spaces 24r of the connector housing portions 24h of the connector portions 24, as shown in FIG. 8, the second externally exposed electrically conductive portions 43 of the second lead wires 4 are fitted to the mating electrically conductive members of the mating connector portions 7B to be electrically conducted.

As shown in FIG. 8, bottom surfaces 25k, 24k of the connector housing portions 25h, 24h of the connector portions 25, 24 are positioned closer to the accommodation chamber 2x side compared to the external wall surface 210 of the top case 21 to be located at the retracted position towards the accommodation chamber 2x side of the control case 2. Thus, a length $\beta 1$ (shown in FIG. 8) showing the projecting length of the connector housing portions 25h from the external wall surface 210 of the top case 21 can be minimized while ensuring the fitting length between the mating connector portions 7A and the connector portions 25. Likewise, a length $\beta 2$ (shown in FIG. 8) showing the projecting length of the connector housing portions 24h form external wall surface 210 of the top case 21 can be reduced while ensuring the fitting length between the mating connector portions 7B and the connector portions 24. The minimization of the lengths $\beta 1$, $\beta 2$ is advantageous to the size reduction of the control case 2.

As shown in FIG. 8, a first control board 51 and a second control board 55 are stacked in a spaced and non-contacting relationship with a predetermined distance therebetween in the accommodation chamber 2x of the control case 2. The first control board 51 and the second control board 55 have approximately the same or slightly smaller dimension compared to the internal dimension of the accommodation chamber 2x. A plurality of mounted devices 52 including electronic parts and electric parts and a plurality annular through holes 51c serving as a hole made of electrically conductive material, which is electrically conductive to the mounted devices 52 via printed electrically conductive passages, are formed on a mounting surface 51a of the first control board 51. The through holes 51c penetrate through the wall thickness of the first control board 51. A plurality of mounted devices 56 including electronic parts and electric parts and a plurality of annular through holes 55c serving as a hole made of electrically conductive material that is electrically conductive to the mounted devices 56 via printed electrically conductive passages are formed on a mounting surface 55a of the second control board 55. As shown in FIG. 8, the through holes 51c of the first control board 51 are provided on the positions corresponding to the first lead wires 3 so that the first internally exposed electrically conductive portions 32 of the first lead wires 3 are inserted into corresponding through holes 51c. The through holes 55c of the second control board 55 are provided on the positions corresponding to the second lead wires 4 so that the second internally exposed electrically conductive portions 42 of the second lead wire 4 are inserted into corresponding through holes 55c.

According to the embodiment shown in FIG. 8, the first control board 51 and the second control board 55 are accommodated in the accommodation chamber 2x of the control case 2 in which the mounting surface 51a of the first control board 51 and the mounting surface 55a of the second control board 55 face each other. In this case, the projecting mounted devices 52 mounted on the mounting surface 51a of the first control board 41 and the projecting mounted devices 56 mounted on the mounting surface 55a of the second control board 55 are arranged not to interfere one another. With foregoing construction without the interference of mounted devices 52, the first control board 51 and the second control board 55 can be closely arranged with respect to each other in the accommodation chamber 2x. This is advantageous to the miniaturization of the control case 2 in the stacking direction of the first control board 51 and the second control board 55. In other words, the above arrangement of the mounting surface 51a of the first control board 51 and the mounting surface 55a of the second control board 55 facing each other advantageously reduces the size on the control case 2 in the stacking direction of the control boards 51, 55.

According to this embodiment, the mounted devices positioned in the accommodation chamber 2x with high heat build-up are mounted on the heat sink 29 instead of on the mounting surface 51a of the first control board 51 and on the mounting surface 55a of the second control board 55. The calorific value of the mounted devices 52, 56 mounted on the mounting surface 51a of the first control board 51 and the mounting surface 55a of the second control board 55 is less than the calorific value of the heat element 57. Accordingly, the heat maintained between the mounting surface 51a of the first control board 51 and the mounting surface 55a of the second control board 55 can be restrained even under the condition that the projecting mounted device 52 of the first control board 51 and the mounted devices 56 of the second control board 55 are arranged facing each other in the accommodation chamber 2x of the control case 2.

As shown in FIG. 8, the first control board 51 is arranged in the accommodation chamber 2x closer to the top case 21 than the second control board 55. The first internally exposed electrically conductive portions 32 of the first lead wires 3 connected to the mating connector portions 7A are inserted into the through hole 51c of the first control board 51 to be soldered thereto. The sealant may be applied to the soldered portion as the need arises. The first lead wires 3 are electrically connected to the mounted devices 52 of the first control board 51 via the soldering of the through hole 51c. Accordingly, the connector portions 25 and the mounted devices 52 of the first control board 51 are electrically connected.

The first internally exposed electrically conductive portions 42 of the second lead wires 4 connected to the mating connector portions 7B are inserted into the respective through holes 55c of the second control board 55 to be soldered thereto. The sealant may be applied to the soldered portion as the need arises. The second lead wires 4 are electrically connected to the mounted devices 56 of the second control board 55 via the soldering of through hole 55c. Accordingly, the connector portions 24 and the mounted devices 56 of the second control board 55 are electrically connected.

As shown in FIG. 8, the heat elements 57 (e.g., three-terminal regulator and triac), which have large calorific value among the mounted devices, are mounted on the exposed portion of the heat sink 29 facing inside of the accommodation chamber 2x. (Note that the heat elements 57 are not provided to produce heat, but rather the generation of heat is a result of the operation of the heat elements 57.) In practice, each heat element 57 is screwed on the heat sink 29 to be closely contacted with the tapping screw 58 serving as the fixture tool inserted into a bore 57a of the heat element 57 via the screw portions 29c of the exposed portion 29b of the heat sink 29. The heat generated at the heat element 57 is transmitted to the heat sink 29 to be released to the outside of the accommodation chamber 2x, thus to be exhausted from the accommodation chamber 2x.

As shown in FIG. 8, sealing projecting portions 21w are formed in a unitary manner on the external wall surface 210 of the top case 21. The sealing projecting portions 21w cover a shaft portion 58m having male screw of the tapping screw 58 and seals the bore shaped screw portions 29c of the heat sink 29c to increase the damp-proof characteristic of the accommodation chamber 2x of the control case 2.

Figure 10:
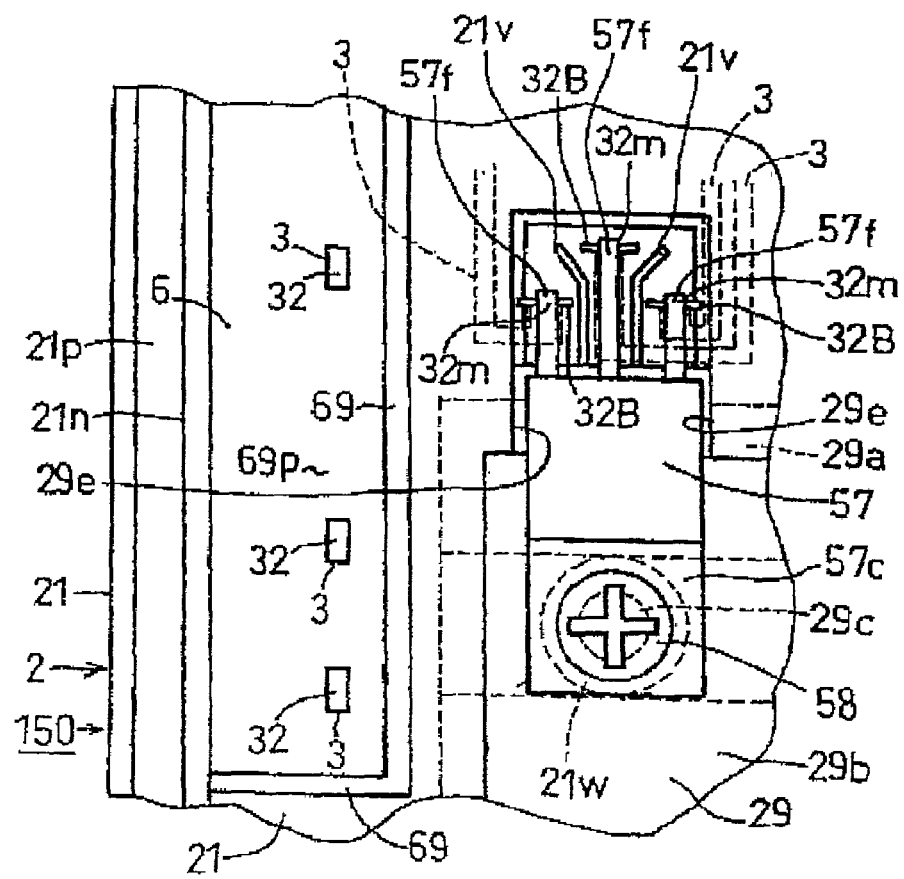
FIG. 10 is a plan view of a main portion showing a condition mounting a heat element to the heat sink with a tapping screw.

As shown in FIG. 10, the position of a body portion 57c of the heat element 57 is determined by contacting a wall surface of the concave-shaped positioning portion 29e of the top case 21. Each heat element 57 includes a plurality of lead terminals 57f. A pair of upright wall portions 21v is provided in a unitary manner on a portion facing the accommodation chamber 2x of the top case. The upright wall portions 21v are positioned between the lead terminals 57f which are adjacent to each other to increase the electric field distance connecting lead terminal 57f adjacent to each other. In other words, the upright wall portions 21v elongate the creepage distance for insulation between the lead terminals 57f provided adjacent to each other in the heat element 57. This is advantageous to prevent electric discharge between the lead terminals 57f provided adjacent to each other in the heat element 57. Thus, the upright wall portions 21v serve as a creepage distance for insulation increasing means.

Figure 9:
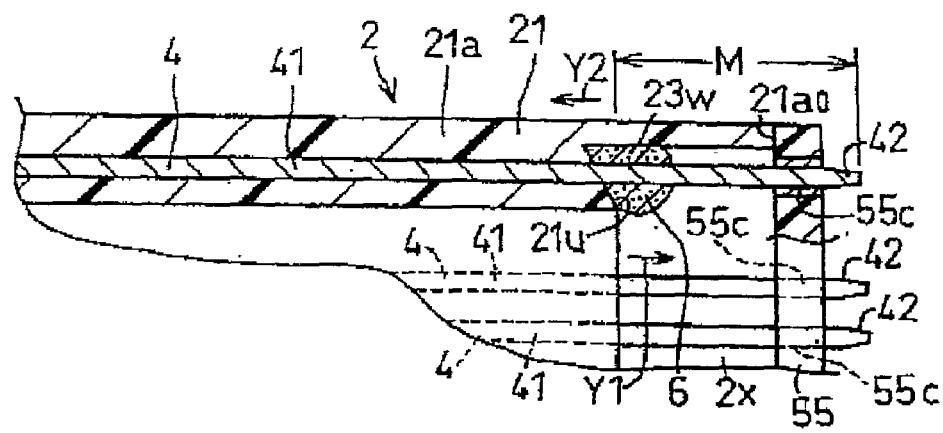
FIG. 9 is a cross-sectional view of a main portion showing a condition that a second lead wire is inserted into a through hole of a second control board and showing the condition that the second control board is attached to the top case.

As shown in FIG. 9, the position of the second control board 55 is determined by contacting a top portion 21a0 of the tall wall portion 21a of the top case 21. A tip end portion of the second internally exposed electrically conductive portion 42 of the second lead wire 4 is inserted into the corresponding through hole 55c of the second control board 55 to be soldered thereto.

As shown in FIG. 9, a sealant 6 is injected to the root of the second internally exposed electrically conductive portion 42 of the second lead wire 4 for sealing the border between the top case 21 and the second lead wire 4. The second internally exposed electrically conductive portion 42 of the second lead wire 4 is projected from a wall portion end surface 21u of the wall portion 21a of the top case 21 to be exposed by length M. Thus, the sealant 6, which could ruin the soldering effect, is unlikely to contact the tip end portion of the second internally exposed electrically conductive portion 42 of the second lead wire 4 to ensure the soldering effect of the second internally exposed electrically conductive portion 42. As shown in FIG. 9, the wall portion end surface 21u of the top case 21 includes an incline for preventing the effusion of the sealant 6 which is applied to the wall portion end surface 21u in a retaining space 23w before being solidified. In other words, the wall portion end surface 21u of the top case 21 has the incline being upward towards the direction shown with an arrow Y1 in FIG. 9 and being downward towards the direction shown with an arrow Y2 in FIG. 9. Thus, the effusion of the sealant 6 before being solidified is restricted and the sealing performance between the top case 21 and the second lead wire 4 can be ensured. Accordingly, the wall portion end surface 21u serves as sealant effusion prevention means. Resin such as silicone resin can be applied as the sealant 6.

Figure 11:
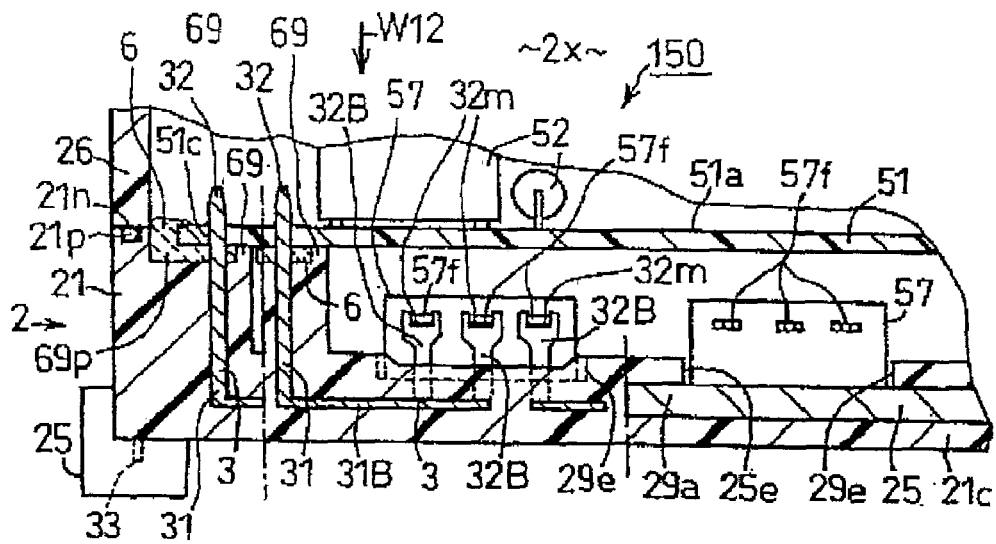
FIG. 11 is a cross-sectional view taken along line XI—XI of FIG. 7.

As shown in FIG. 11, the first lead wire 3 includes a first embedded electrically conductive portion 31B being embedded in the thickness of the top case 21. A first internally exposed electrically conductive portion 32B is arranged in the accommodation chamber 2x and projected from the top case 21 to be exposed close to the heat element 57. Each tip portion of the first internally exposed electrically conductive portion 32B has a concave shape including a central space 32m. That is, the tip portion of the internally exposed electrically conductive portion 32B of the first lead wire 3 has a U shape including the central space 32m. In this case, as shown in FIG. 11, the electric connection of the lead terminal 57f of the heat element 57 mounted on the heat sink 29 and the first internally exposed conductive portion 32B become easier by fitting the lead terminal 57f in the central space 32m located at the tip portion of the first internally exposed electrically conductive portion 32B. The damp-proof characteristic of the connecting portion is increased by being applied with the resin made sealant (not shown) after soldering the lead terminal 57f and tip portion of the first internally exposed electrically conductive portion 32B. Because the tip portion of the first internally exposed electrically conductive portion 32B of the first lead wire 3 has a U shape having the central space 32, a sufficient soldering amount at the first internally exposed electrically conductive portion 32B, a sufficient soldering area, and a sufficient sealant application amount can be ensured. In addition, because the tip portion of the first internally exposed electrically conductive portion 32B has a U shape, it is advantageous to easily fit the lead terminals 57f of the heat element 57 therein even when there are plural lead terminals 57f.

Figure 12:
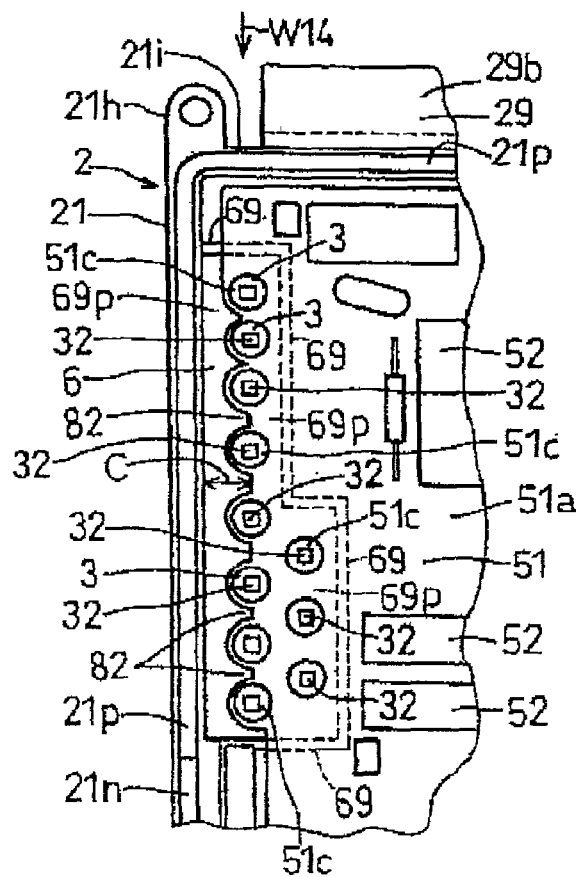
FIG. 12 is a view viewed from an arrow W12 of FIG. 11.

According to this embodiment, as shown in FIGS. 11 and 12, an upward projecting wall portion 69 serving as a retaining space forming means is formed in a unitary manner on the top case 21. The position of the surface of the first control board 51 is determined by contacting the projecting wall portion 69 of the top case 21. A retaining space 69p having a shallow bottom is formed on the wall portion of the case 21 with the projecting wall portion 69. The resin made sealant 6 is supplied to the retaining space 69p for sealing the border between the top case 21 and the first lead wires 3 embedded therein to improve the damp-proof characteristic. In addition, as shown in FIG. 11, the resin made sealant 6 is injected to the surface of the first control board 51 for ensuring the retention of the first control board 51. The projecting wall portion 69 prevents the effusion of the sealant 6 from the retaining space 69p to the outside of the retaining space 69p and the sealing performance by the sealant 6 is retained. The sealant 6 is applied to the retaining space 69p because the high electric pressure is apt to be applied to the electric connecting portion of this portion.

Figure 13:
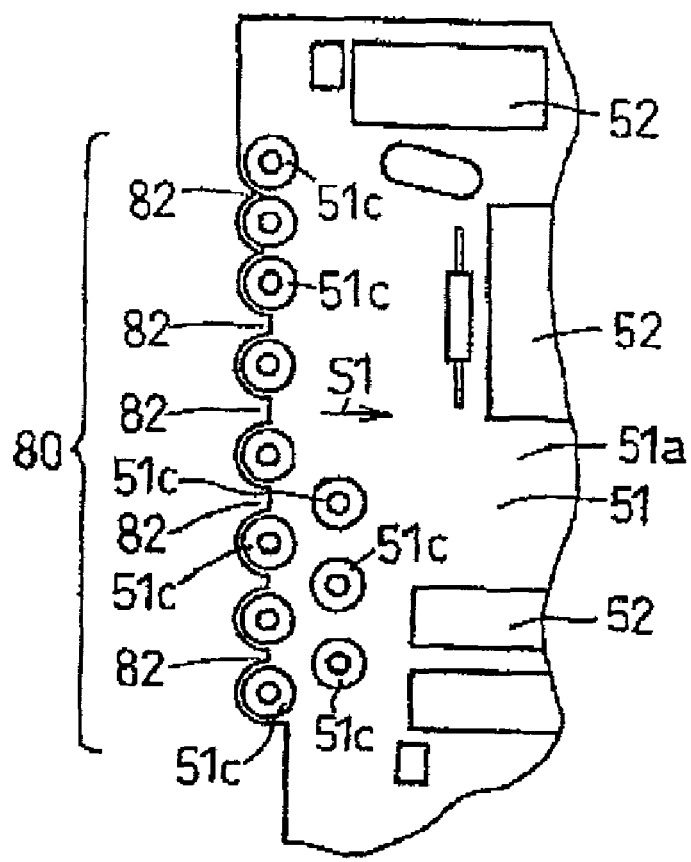
FIG. 13 is a view showing a main portion of a first control board viewed from the arrow W12 of FIG. 11.

As shown in FIG. 13, a group of recesses 80 including numbers of recesses 82 is formed on a rim of the first control board 51 corresponding to the retaining space 69p side. The recesses 82 are formed retracting in the direction of an arrow S1 between adjacent through holes 51c. In this case, as shown in FIG. 12, because a distance C between the top case 21 and the inner rim of the first board 51 is ensured, it becomes easier to supply the resin made sealant 6 to the retaining space 69p of the top case 21 before being solidified.

Figure 14:
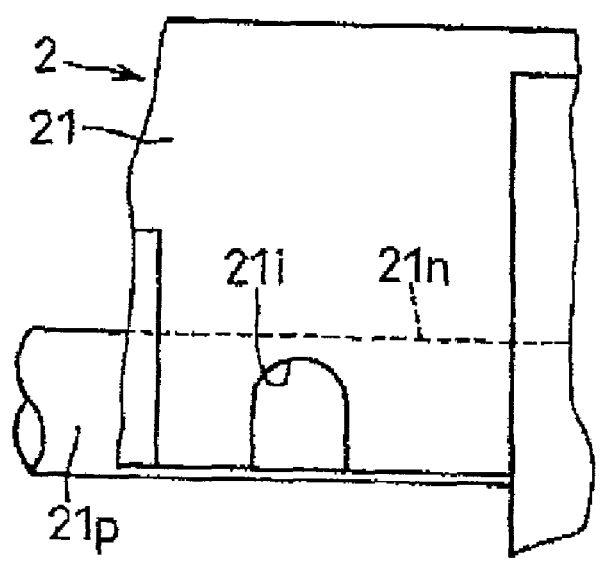
FIG. 14 is a partial side view viewed from an arrow W14 of FIG. 12 for showing a construction of an observing window for visually observing the existence of a sealing member.

Accordingly to this embodiment, as shown in FIG. 14, an observing window 21i is formed around the sealing groove of the top case 21. Because whether the sealing member 21p is provided in the sealing groove 21n can be visually observed from the observing window 21i, the sealing member 21p can be securely provided without fail. Thus, the damp-proof characteristic of the accommodation chamber 2x can be increased. Accordingly, the observing window 21i serves as a sealing member confirmation means for confirming if the sealing member 21p is provided.

Depressurization may be caused in the accommodation chamber 2x by the repetition of the heat cycling between heat generation during operation of the heat element 57 and cooling during non-operation of the heat element 57 provided in the accommodation chamber 2x of the control case 2. In this case, the breathing effect (i.e. the water is moved towards the direction with low pressure due to the pressure differences) in the control case 2 may be caused in accordance with the depressurization. When the control device for sanitary device for toilet assembly is used over the long term, a small amount of the water outside of the control case 2 may infiltrate into the accommodation chamber 2x of the control case 2 from the border between the second lead wire 4 and the top case 21 by the breathing effect although the first lead wire 3 and the second lead wire 4 are concealed to be embedded in the thickness of the top case 21. Accordingly, as shown in FIG. 8, a small air relief recess 26t for communicating the inside with the outside of the accommodation chamber 2x is formed on the bottom case 26. The pressure differences between the inside and the outside of the accommodation chamber 2x is always controlled to be balanced by the air relief recess 26t. Thus, using the air relief recess 26t, the breathing effect in the control case 2 is restricted and the infiltration of the water from the border between the second lead wire 4 and the top case 21 to the accommodation chamber 2x restricted. Thus, the damp-proof charateristic of the accommodation chamber 2x is ensured. As shown in FIG. 8, the air relied recess 26t is blocked by the heat sink 29 to block the invasion of the dust and the water to the accommodation chamber 2x. The air relief recess 26t may be formed on the top case 21 or on the heat sink 29 instead of being formed on the bottom case 26.

According to this embodiment, the control case 2 may be assembled in the following order; the first control board 51 is assembled to the top case 21; the second control board 5 is assembled to the top case; and the bottom case 26 is assembled to be connected with the top case 21.

As explained above, according to this embodiment, because the first lead wires 3 and the second lead wires 4 serving as the electrically conductive members electrically connected to the mounted devices 52, 56 of the control device 150 are embedded in the wall thickness of the wall portion of the resin made control case 2, the space for accommodating the first lead wires 3 and the second lead wires 4 is not required in the accommodation chamber 2x. Thus, this configuration is advantageous to the miniaturization of the control case 2 of the control device 150.

Because the first lead wires 3 and the second lead wires 4 are embedded in the wall thickness of the resin made control case 2, the damp-proof characteristic of the first lead wires 3 and the second lead wires 4 is improved and the invasion of water, urine and moisture content to the accommodation chamber 2x is restricted. This is further advantageous to prevent the failure due to the water, the urine, and the moisture content.

According to this embodiment, the control board is divided into plural numbers. That is, the first control board 51 and the second control board 55 are stacked keeping a predetermined distance from each other in the accommodation chamber 2x of the control case 2. This configuration is advantageous to the miniaturization of the control case 2. In addition, according to this embodiment, the first control board 51 and the second control board 55 are arranged facing the respective mounting surfaces 51a, 55a boarding the mounted devices 52, 56 to each other so that the mounted devices 52 of the mounting surface 51a of the first control board 51 and the mounted devices 56 of the mounting surface 55a of the second control board 55 do not interfere with one another. Thus, the size of the control boards 51, 55 in the stacking direction can be further reduced.

According to the embodiment, the control case 2 includes the top case 21 and the bottom case 26 whose mating surfaces are connected to each other, and the sealing member 21p provided on the mating surface between the top case 21 and the bottom case 26. Thus, the sealing performance and the damp-proof characteristic of the accommodation chamber 2x of the control case 2 are increased. In addition, because the observing window 21i for visually confirming the existence of the sealing member 21p is formed on the control case 2, the sealing member 21p can be provided without fail. Thus, the sealing performance and the damp-proof characteristic of the accommodation chamber 2x of the control case 2 are improved.

The control device for a sanitary device for a toilet assembly of the present invention is not limited to the foregoing embodiment and variations may be made within the scope of the invention recited in the claims. For example, the first lead wires 3 and the second lead wires 4 may be embedded in the bottom case 26 instead of being embedded in the top case 21. The first lead wire 3 and the second lead wire 4 may be embedded in both the top case 21 and the bottom case 26. Although the first control board 51 and the second control board 55 are stacked keeping the predetermined distance from each other in the accommodation chamber 2x according to the foregoing embodiment, the number of control boards may be varied from two to one, three or more. Although the metal-made first lead wires 3 and the second lead wires 4 are embedded in the wall thickness of the top case 21, an electrically conductive member covering the metal member with an insulating coat may be embedded in the wall thickness of the top case 21.

According to the control device for a sanitary device for a toilet assembly of the present invention, the electrically conductive members electrically connected to the mounted devices in the accommodation chamber of the control case is embedded in the wall thickness of the wall portion of the control case which is made of resin. Thus, the space for accommodating the electrically conductive member in the control case is not required or is reduced. This configuration is advantageous to the miniaturization of the control case. In addition, the electrically conductive members electrically connected to the mounted devices in the accommodation chamber are embedded in the wall thickness of the wall portion of the control case which is made of resin, thus the damp-proof characteristic of the electrically conductive member is further increased and failure of the device due to the invasion of water, urine, and moisture content can be restricted.

In the configuration where the heat sink for mounting the heat element is embedded in the control case, the fixture tool for mounting the heat sink to the control case can be eliminated. In addition, because the exposed portion of the heat sink is projected from the control case to be exposed instead of being embedded therein, the heat release from the exposed portion of the heat sink to the outside of the accommodation chamber of the control case is ensured. Particularly, when the heat element with high calorific value is mounted on the exposed portion, it is advantageous to release the heat of the heat element.

According to the control device of the present invention, the control board boarded with the mounted devices is divided into a plural number arranged in a stacked configuration with a predetermined spacing distance in the accommodation chamber. This configuration advantageously reduces the size of the control case. Furthermore, the configuration in which plural control boards are arranged to be stacked keeping the predetermined distance in the accommodation chamber of the control case facing the respective mounting surfaces mounted with the mounted devices advantageously further reduces the size of the control case.

According to the control device of the present invention, the sealant is applied to the border between the electrically conductive member and the control case, thus the damp-proof characteristic relative to the electrically conductive member is further improved.

In a configuration in which the control case includes a retaining space for retaining the sealant at the root portion of the electrically conductive member projected from the control case to be exposed, the root portion for the electrically conductive member can be effectively sealed with the sealant retained in the retaining space.

The mounted devices are mounted on the control board arranged in the accommodation chamber of the control case. In the configuration in which the recesses facing the retaining space for improving the injection performance of the sealant to the retaining space are formed on the control board, the injection performance of the sealant to the retaining space can be improved.

The control case made of resin has high electric insulation. Resin used for forming the control case is not limited and known resins such as polyamide, polybutylene terephthalate, polypropylene, polycarbonate, ABS, PMMA, POM, PBT can be adopted. The electrically conductive members embedded in the control case preferably include an electrically conductive wire, a printed circuit, and a lead wire. The electrically conductive member is preferably made of an electrically conductive material such as phosphor bronze, copper, aluminum, steel, stainless steel, titanium, gold, and alloyed metal of any combinations of those materials.

According to the control device of the present invention, the damp-proof characteristic is ensured because the electrically conductive member connected to the mounted devices including the electronic parts and the electric parts accommodated in the accommodation chamber of the control case are embedded in the wall portion of the control case. In order to increase the damp-proof characteristic, the electrically conductive member may be completely embedded in the wall thickness of the wall portion of the control case to be concealed or at least one of the end portions of the electrically conductive member may be exposed to the external wall surface of the control case while the other portion of the electrically conductive member is embedded in the wall portion of the control case.

The electrically conductive member may electrically conduct between the mounted devices in the accommodation chamber of the control case and the connector portion or may electrically conduct between the mounted devices in the accommodation chamber of the control case. In the configuration in which the electrically conductive member electrically conducts between the mounted devices in the accommodation chamber of the control case, the mounted devices mounted on the mounting surface of the control board arranged in the accommodation chamber and the mounted devices mounted on the heat sink provided in the control case may be electrically connected. Otherwise, in the configuration in which the electrically conductive member electrically conducts between the mounted devices in the accommodation chamber of the control case, the mounted devices mounted on the mounting surface of the control board arranged in the accommodation chamber of the control case may be electrically connected to each other. This configuration advantageously releases the Joule heat generated during the electrical conduction to the electrically conductive member from the exposed electrically conductive portion to the outside of the case. In addition, this configuration is advantageous to easily electrically connect the terminal of the mounted devices in the accommodation chamber to the exposed electrically conductive portion of the electrically conductive member.

At least part of tip portions of the exposed electrically conductive portions of the electrically conductive member includes a recess having a central space. The recess having a central space preferably has a U-shaped configuration, a Y-shaped configuration, a C-shaped configuration, or other similar configuration. In this case, by arranging the lead terminal of the mounted devices (including the mounted devices mounted on the heat sink) accommodated in the accommodation chamber in the central space including the recess shape tip portion of the exposed electrically conductive portion, the lead terminal and the tip portion of the exposed electrically conductive portion can be easily electrically connected. It is preferable to solder the connection between the lead terminal and the tip portion of the exposed electrically conductive portion.

The mounted devices including the electronic parts and the electric parts may be mounted on the mounting surfaces of the control board arranged in the accommodation chamber of the control case. In this configuration, plural control boards are arranged in the accommodation chamber of the control case so that the control boards are stacked keeping a predetermined distance. The control boards may have approximately the same dimension to the internal dimension of the accommodation chamber of the control case or have slightly smaller dimension relative to the internal dimension of the internal dimension of the accommodation chamber of the control case. The control boards include holes such as through holes electrically connected to the mounted devices. The hole corresponds to the electrically conductive member having bore soldered while being inserted with the mating electrically conductive member. The hole may be a penetrated through hole or a hole without penetration.

At least a part of the electrically conductive member includes the embedded electrically conductive portion and the exposed electrically conductive portion projected from the control case to be exposed. The tip portion of the exposed electrically conductive portion of the electrically conductive member is inserted into the hole such as the through hole of the control board to be soldered. Thus, the electrically conductive member embedded in the wall portion of the control case can be electrically connected to the mounted devices of the control board via the hole such as the through hole of the control board.

At least two control boards are arranged facing the respective mounting surfaces mounted with the mounted devices so that the mounted devices do not interfere with each other, thus the size of the control case is reduced in the stacking direction of the control boards.

The control case includes a plurality of cases having mating surfaces and mated at the mating surfaces, and a sealing member provided between the mating surfaces of plural cases for increasing the sealing performance of the accommodation chamber of the control case. Thus, the sealing performance and the damp-proof characteristic of the accommodation chamber are ensured.

The control case includes an observing window for confirming the existence of the sealing member from outside of the control case. Thus, the sealing member can be securely provided without fail and the sealing performance and the damp-proof characteristic of the accommodation chamber of the control case can be increased.

The control case includes the heat sink made of material for heat radiation. In this configuration, the heat sink includes the embedded portion formed in a unitary manner on the control base by insertion forming and the exposed portion projected from the control case to be exposed and mounted with the heat element. Because the heat sink is provided in a unitary manner in the control case to be embedded therein, the fixture tool for fixing the heat sink to the control case can be eliminated. In addition, because the exposed portion of the heat sink is projected from the control case to be exposed instead of being embedded in the control case, the heat radiation to the outside of the accommodation chamber can be ensured. In particular, mounting the heat element with high calorific value on the exposed portion of the heat sink is advantageous to release the heat generation of the heat element. In this case, it is preferable to mount the mounted devices with high calorific value on the heat sink and to mount the mounted devices with small calorific value on the control boards.

The control case includes a retaining space for retaining the sealant at the root portion of the electrically conductive portion projected from the control case to be exposed. It is preferable that numerous electrically conductive members are exposed to one retaining space. In this configuration, by supplying the sealant to the one retaining space to be solidified, plural electrically conductive members can be sealed simultaneously, thus increasing the damp-proof characteristic of the control device. It is preferable that the bottom surface of the retaining space is sloped such that the depth increases as the distance away from the accommodation chamber increases (i.e. the bottom surface declines away from the accommodation chamber). Thus, the sealant retained at the retaining space is prevented from flowing out to the accommodation chamber side.

The mounted devices are mounted on the control board arranged in the accommodation chamber of the control case and include recesses facing the retaining space for increasing the injection of the sealant to the retaining space. The injection performance of the sealant to the retaining space can be increased by the recesses.

Mounted devices including the electronic parts and the electric parts are mounted on the mounting surface of the control board arranged in the accommodation chamber of the control case. In this case, a plurality of the control boards are arranged in the accommodation chamber of the control case to be stacked keeping the predetermined distance.

The control case includes an opening and the exposed portion of the heat sink closes the opening of the control case. In this configuration, because the exposed portion of the heat sink closes the accommodation chamber (i.e., the opening of the control case), it is advantageous to help conceal or to approximately conceal the accommodation chamber of the control case using the heat sink so that the damp-proof characteristic relative to the accommodation chamber can be increased. In addition, because the heat sink is embedded in the control case, the amount of the resin necessary for forming the control case is reduced while ensuring the volume of the control case, which also reduces the manufacturing costs of the control device. The shape of the heat sink is not limited to a particular shape, and can be, for example, an L-shaped cross-section, a U-shaped cross-section, an I-shaped cross-section, or a C-shaped cross-section. It is preferable that the heat sink is made of material with high heat radiation qualities. In general, the heat sink is made of metal such as aluminum, steel, stainless steel, copper, titan, and alloy with any combinations thereof.

The wall portion of the control case close to the heat sink includes the positioning portion for determining the position of the heat element. Thus, the mounting of the heat element is easy. In this case, it is preferable that the heat sink includes the screwing portion for screwing the heat element to the control case. The screwing portion includes at least one of female screw, male screw, and recess-convex engagement.

The control case includes the connector portion provided on the external wall surface side of the control case and electrically connected to the mating connector. The connector portion includes the connector housing portion fitted to the mating connector and formed in a unitary manner with the control case. At least part of the exposed electrically conductive portions of the electrically conductive member is provided on the connector housing. In this configuration, the bottom surface of the housing portion of the connector portion is provided closer to the accommodation chamber side of the control case compared to the external wall surface side of the control case. This is advantageous to the miniaturization of the control device as a whole.

The wall portion for increasing a distance for connecting the lead terminals adjacent to one another is formed in a unitary manner with the control case between the lead terminals adjacent to each other of the heat element. In this configuration, the creepage distance for insulation between the adjacent lead terminals can be elongated. Thus, this configuration is advantageous to prevent the electric discharge between the lead terminals of the heat element.

At least a part of the electrically conductive members may include an embedded electrically conductive portion embedded in the wall portion of the control case and an exposed electrically conductive portion projected from the control case to be exposed.

The principle, preferred embodiment, and mode of operation of the present invention have been described in the foregoing specification. However, the invention which is intended to be protected is not to be construed as limited to the particular embodiment disclosed. Furthermore, the embodiment described herein is to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A control device for a sanitary device for a toilet assembly including a shower portion for spurting cleansing fluid to anus or genitals of an individual for washing thereof, said control device comprising:
   a control case made of resin and including an accommodation chamber therein;
   mounted devices including an electric part and an electronic part accommodated in the accommodation chamber of the control case; and
   an electrically conductive member made of electrically conductive material and embedded in a wall portion of the control case and having a first end portion electrically conductive to a part of the mounted devices and a second end portion electrically conductive to one of a connector and another part of the mounted devices in the accommodation chamber,
   wherein the control case comprises a heat sink made of material having heat radiation, the heat sink comprising an embedded portion formed in a unitary manner on the control case by insertion forming and an exposed portion projected from the control case to be exposed on which a heat element is mounted, and
   wherein the exposed portion of the heat sink closes the accommodation chamber of the control case.

2. A control device for a sanitary device for a toilet assembly according to claim 1, wherein:
   the mounted devices are mounted on a control board arranged in the accommodation chamber; and
   the control board comprises a hole electrically connected to the mounted devices, at least one of the first end portion and the second end portion of the electrically conductive member is exposed to extend from the control case via the hole.

3. A control device for a sanitary device for a toilet assembly according to claim 1, wherein at least part of the mounted devices includes the heat element, and wherein a wall portion of the control case close to the heat sink comprises a positioning portion for determining a position of the heat element.

4. A control device for a sanitary device for a toilet assembly according to claim 1, wherein the control case comprises a connector portion provided on an outside wall surface side of the control case for electrically connecting with a mating connector portion, the connector portion comprises a connector housing portion fitted to the mating connector portion and formed in a unitary manner with the control case, and the first end portion or the second end portion of the electrically conductive portion is provided on the connector housing.

5. A control device for a sanitary device for a toilet assembly according to claim 4, wherein the connector housing portion of the connector portion comprises a bottom surface arranged closer to the accommodation chamber side of the control case relative to an outside surface of the control case.

6. A control device for a sanitary device for a toilet assembly including a shower portion for spurting cleansing fluid to anus or genitals of an individual for washing thereof, said control device comprising:
   a control case made of resin and including an accommodation chamber therein;
   mounted devices including an electric part and an electronic part accommodated in the accommodation chamber of the control case;
   an electrically conductive member made of electrically conductive material and embedded in a wall portion of the control case and having a first end portion electrically conductive to a part of the mounted devices and a second end portion electrically conductive to one of a connector and another part of the mounted devices in the accommodation chamber;

a mounting surface for mounting at least part of the mounted devices; and a plurality of control boards stacked at a predetermined distance from each other in the accommodation chamber, wherein the control case comprises plural divided cases each having a mating surface and mated at respective mating surfaces, and a sealing member provided on one of the mating surfaces of the plural divided cases.

7. A control device for a sanitary device for a toilet assembly according to claim 6, wherein at least two control boards are arranged facing respective mounted devices mounted thereon towards one another so that the respective mounted devices on the mounting surfaces of the control boards are positioned in respective spaces between said two control boards, whereby the at least two control boards do not interfere with one another.

8. A control device for a sanitary device for a toilet assembly according to claim 6, further comprising an air relief recess provided on another of the mating surfaces of the plural divided cases for relieving air therethrough.

9. A control device for a sanitary device for a toilet assembly according to claim 6, wherein the control case further comprises an observing window for confirming an existence of the sealing member from outside of the control case.

10. A control device for a sanitary device for a toilet assembly according to claim 6, wherein:

the control case further comprises a heat sink projected from the control case to be exposed; and part of the mounted devices having relatively large calorific value among the mounted devices are mounted on the heat sink and another part of the mounted devices having relatively small calorific value among the mounted devices are mounted on the mounting surface of the control boards arranged in the accommodation chamber facing the respective mounting surfaces towards each other.

11. A control device for a sanitary device for a toilet assembly including a shower portion for spurting cleansing fluid to anus or genitals of an individual for washing thereof, said control device comprising:

a control case made of resin and including an accommodation chamber therein;

mounted devices including an electric part and an electronic part accommodated in the accommodation chamber of the control case;

an electrically conductive member made of electrically conductive material and embedded in a wall portion of the control case and having a first end portion electrically conductive to a part of the mounted devices and a second end portion electrically conductive to one of a connector and another part of the mounted devices in the accommodation chamber; and a sealant applied to a border between the electrically conductive member and the control case, wherein the control case further comprises a retaining space for retaining the sealant at a root portion of the electrically conductive member projected from the control case to be exposed, wherein the mounted devices are mounted on a control board arranged in the accommodation chamber of the control case, and wherein the control board further comprises a recess facing the retaining space.

12. A control device for a sanitary device for a toilet assembly according to claim 11, wherein the retaining space comprises a bottom surface declining away from the accommodation chamber.

* * * * *

UNITED STATES PATENT AND TRADEMARK OFFICE
CERTIFICATE OF CORRECTION

PATENT NO. : 7,155,753 B2
APPLICATION NO. : 10/166166
DATED : January 2, 2007
INVENTOR(S) : Murakami et al.

Page 1 of 1

It is certified that error appears in the above-identified patent and that said Letters Patent is hereby corrected as shown below:

On the title page, Item (30), the Foreign Application Priority Data information is incorrect. Item (30) should read:

-- (30) Foreign Application Priority Data

Jun. 18, 2001 (JP)........................ 2001-083847
Jun. 18, 2001 (JP)........................ 2001-183873
Jun. 11, 2001 (JP)........................ 2001-176238 --

Signed and Sealed this

Twentieth Day of March, 2007

JON W. DUDAS
*Director of the United States Patent and Trademark Office*